United States Patent
Biagi

(10) Patent No.: US 7,466,115 B2
(45) Date of Patent: Dec. 16, 2008

(54) SOFT-START CIRCUIT AND METHOD FOR POWER-UP OF AN AMPLIFIER CIRCUIT

(75) Inventor: Hubert Biagi, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 441 days.

(21) Appl. No.: 11/231,215

(22) Filed: Sep. 19, 2005

(65) Prior Publication Data

US 2007/0063736 A1    Mar. 22, 2007

(51) Int. Cl.
G05F 1/40    (2006.01)
G05F 1/56    (2006.01)

(52) U.S. Cl. ...................... 323/280; 323/273
(58) Field of Classification Search .......... 323/268, 323/270, 271, 273, 275, 280–285
See application file for complete search history.

(56) References Cited

U.S. PATENT DOCUMENTS

| | | | | |
|---|---|---|---|---|
| 6,046,577 A * | 4/2000 | Rincon-Mora et al. | ...... | 323/282 |
| 6,310,467 B1 * | 10/2001 | Sauer | ...... | 323/273 |
| 6,703,813 B1 * | 3/2004 | Vladislav et al. | ...... | 323/270 |
| 6,703,815 B2 * | 3/2004 | Biagi | ...... | 323/280 |
| 7,253,596 B2 * | 8/2007 | Yamamoto et al. | ...... | 323/281 |

* cited by examiner

Primary Examiner—Matthew V Nguyen
(74) Attorney, Agent, or Firm—Warren L. Franz; Wade J. Brady, III; Frederick J. Telecky, Jr.

(57) ABSTRACT

A method and circuit for providing a soft start-up process for an amplifier circuit to reduce or prevent destructive overshoot of an output voltage are provided. In accordance with an exemplary embodiment of the present invention, an exemplary method and circuit are configured to suitably momentarily replace an actual fixed reference voltage with a second reference voltage during the start-up process. Such a method and circuit can provide a fast start-up process without destructive overshoot and without affecting or compromising any control loop of the amplifier circuit, and can be configured within various applications. In accordance with an exemplary embodiment, an exemplary amplifier circuit is configured with a soft-start circuit, with the soft-start circuit configured to provide a secondary reference voltage during initial start-up before switching to an actual reference voltage. For example, an exemplary start-up circuit can be configured to generate a secondary reference voltage, and then though monitoring of a feedback voltage from an amplifier circuit, suitably switch in the secondary reference voltage and actual reference voltage to provide a controlled start-up process.

23 Claims, 4 Drawing Sheets

SOFT-START CIRCUIT AND METHOD FOR POWER-UP OF AN AMPLIFIER CIRCUIT

FIELD OF INVENTION

The present invention relates to power supply circuits. More particularly, the present invention relates to a soft-start circuit and method for power up of an amplifier circuit.

BACKGROUND OF THE INVENTION

The increasing demand for higher performance power supply circuits has resulted in the continued development of voltage regulator and other power management devices. For example, many low voltage applications require the use of low dropout (LDO) regulators, such as for use in cellular phones, pagers, laptops, camera recorders and other wireless and mobile battery operated devices. These portable electronics applications typically require power management devices having a low voltage and quiescent current flow to facilitate increased battery efficiency and longevity. Such low dropout regulators generally provide a well-specified and stable dc voltage whose input to output voltage difference is low.

With reference to FIG. 1, an exemplary single channel amplifier circuit 100, such as an LDO, receiving an input voltage $V_{IN}$ and generating an output voltage $V_{OUT}$ through a load device $R_{LOAD}$ is illustrated. An enable pin ENABLE is used to power-up circuit 100 to turn on output voltage $V_{OUT}$. Typically, enable pin ENABLE can be used to power-up circuit 100 in two manners.

In the first manner, enable pin ENABLE is connected to input voltage $V_{IN}$ to power-up circuit 100 and turn on output voltage $V_{OUT}$. With reference to FIG. 2B, when power is turned on, input voltage $V_{IN}$ takes some amount of time to reach its steady level, possibly with some overshoot condition begin realized during power-up. Ideally, output voltage $V_{OUT}$ will be immune to what happens with input voltage $V_{IN}$, ramping up in a smooth manner. However, in many instances output voltage $V_{OUT}$ will also realize overshoot conditions, which if greater than approximately 10% can be destructive. In the second manner, input voltage $V_{IN}$ is already turned on and established, and then ENABLE pin is enabled to turn on amplifier circuit 100. For example, with reference to FIG. 2, ENABLE pin and input voltage $V_{IN}$ have the same response curves upon connection, but output voltage $V_{OUT}$ can still tend to ramp up and exhibit destructive overshoot characteristics. Employing a bypass capacitor or other noise reduction capacitor can minimize the overshoot; however another concern is the ramp-up time that should be minimized for fast start-up LDO devices, with 50 microseconds or less in ramp-up time desirable.

For dual channel devices, the power-up process becomes more difficult to control. For example, with reference to FIG. 3A, a dual channel amplifier circuit 300 having a first error amplifier circuit 302 and a second error amplifier 304 is illustrated with dual enable pins $ENABLE_1$ and $ENABLE_2$ and a bandgap voltage $V_{BG}$. Such dual channels are totally independent, with first enable pin $ENABLE_1$ enabled and then second enable pin $ENABLE_2$ enabled, or both pins $ENABLE_1$ and $ENABLE_2$ enabled together. Bandgap voltage $V_{BG}$ is powered up with the rest of amplifier circuit 300, e.g., when first enable pin $ENABLE_1$ is enabled and error amplifier circuit 302 and output voltage $V_{OUT2}$ are turned on. With reference to FIG. 3B, once enable pin $ENABLE_2$ is enabled (referencing a fixed reference voltage $V_{IN}$), output voltage $V_{OUT2}$ ramps up without being suitably controlled and thus realizes overshoot conditions, exceeding not only bandgap voltage $V_{BG}$ but also input voltage $V_{IN}$ before settling. For example, with reference to FIG. 4, an amplifier circuit 400 such as used within a dual channel circuit can comprise an error amplifier 402 configured with a bandgap voltage $V_{BG}$ and feedback voltage $V_{FB}$ in a control loop. Despite the control loop, error amplifier 402 is nonetheless susceptible to permitting overshoot by output voltage $V_{OUT2}$ since a fixed reference voltage is being referenced rather than a reference voltage that gradually ramps upward. In some instances, the dynamics for the control loop for error amplifier circuit 402 can be redesigned, tweaked or otherwise reconfigured to address the overshoot conditions, but such attempts tend to compromise the overall amplifier circuit, and/or result in additional complexity. For example, a P-channel input device for error amplifier 402 can be implemented, with degrading of the overall noise performance of amplifier circuit 400 as a result.

SUMMARY OF THE INVENTION

In accordance with various aspects of the present invention, a method and circuit for providing a soft start-up process for an amplifier circuit to reduce or prevent destructive overshoot of an output voltage are provided. In accordance with an exemplary embodiment of the present invention, an exemplary method and circuit are configured to suitably momentarily replace an actual fixed reference voltage with a second reference voltage during the start-up process. Such a method and circuit can provide a fast start-up process without destructive overshoot and without affecting or compromising any control loop of the amplifier circuit. Accordingly, an exemplary method and circuit can be configured within various applications and/or retrofitted within existing applications.

In accordance with an exemplary embodiment, an exemplary amplifier circuit is configured with a soft-start circuit, with the soft-start circuit configured to provide a secondary reference voltage during initial start-up before switching to an actual reference voltage. For example, an exemplary start-up circuit can be configured to generate a secondary reference voltage, and then though monitoring of a feedback voltage from an amplifier circuit, suitably switch in the secondary reference voltage and actual reference voltage to provide a controlled start-up process. The secondary reference voltage suitably comprises the minimum amount of voltage required for power-up of the amplifier circuit components to permit operation. In accordance with an exemplary embodiment, the secondary reference voltage can be generated by current source configured with a temperature compensating circuit to provide fast and reliable power source; however, the secondary reference voltage can also be generated in various other manners and configurations.

In accordance with an exemplary embodiment of the present invention, the soft-start circuit suitably comprises a second reference voltage, a switching circuit, and a logic circuit. In such an embodiment, the start-up circuit is configured to generate a secondary reference voltage, and then though monitoring with the logic circuit the feedback voltage from the amplifier circuit, use the switching circuit to suitably switch in the secondary reference voltage. Once the feedback voltage meets or exceeds the secondary reference voltage, soft-start circuit can suitably switch in the actual reference voltage. As a result, destructive overshoot of the output voltage can be suitably reduced or eliminated.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE INVENTION

The present invention may be described herein in terms of various functional components and various processing steps. It should be appreciated that such functional components may be realized by any number of hardware or structural components configured to perform the specified functions. For example, the present invention may employ various integrated components, such as buffers, current mirrors, and logic devices comprised of various electrical devices, e.g., resistors, transistors, capacitors, diodes and the like, whose values may be suitably configured for various intended purposes. In addition, the present invention may be practiced in any integrated circuit application. However for purposes of illustration only, exemplary embodiments of the present invention will be described herein in connection with a low dropout regulator for use with power supply circuits. Further, it should be noted that while various components may be suitably coupled or connected to other components within exemplary circuits, such connections and couplings can be realized by direct connection between components, or by connection through other components and devices located thereinbetween.

In accordance with various aspects of the present invention, a method and circuit for providing a soft start-up process for an amplifier circuit can suitably reduce or prevent destructive overshoot of an output voltage that can occur when a power management device is turned on. In accordance with an exemplary embodiment, an exemplary method and circuit can be configured to momentarily replace an actual fixed reference voltage with a secondary reference voltage during the start-up process of the amplifier circuit. Such a method and circuit can be utilized without affecting or compromising the control loop of the amplifier circuit.

Such a method and circuit can be useful in various applications. For example, an exemplary method and circuit for providing a soft-start process can suitably reduce destructive overshoot in dual channel amplifier circuits, such as dual channel LDO regulator circuits, having a single bandgap reference voltage. An exemplary method and circuit for providing a soft-start process can also be configured within any other amplifier circuit application where a controlled start-up process is desirable.

Figure 1:
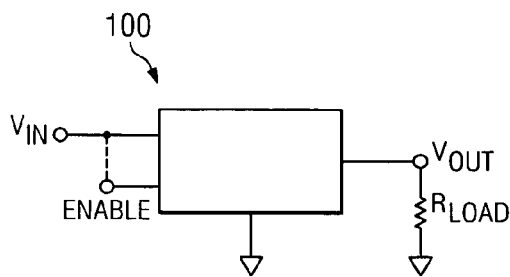
FIG. 1 illustrates a block diagram of a prior art power management device and single channel amplifier circuit.
Figure 2A:
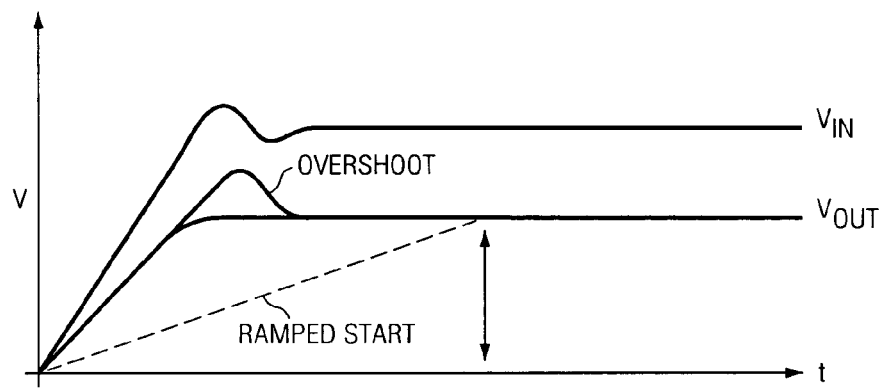
FIGS. 2A and 2B illustrate curves representing the voltage characteristics of a prior art single channel amplifier circuit.
Figure 2B:
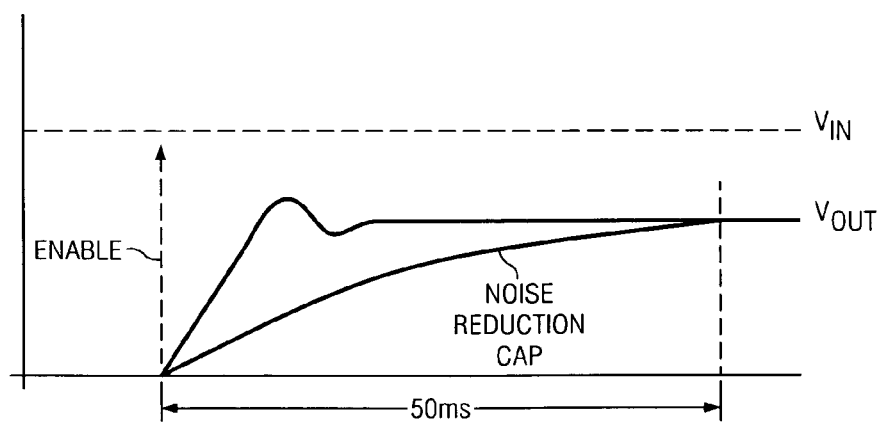
Figure 3A:
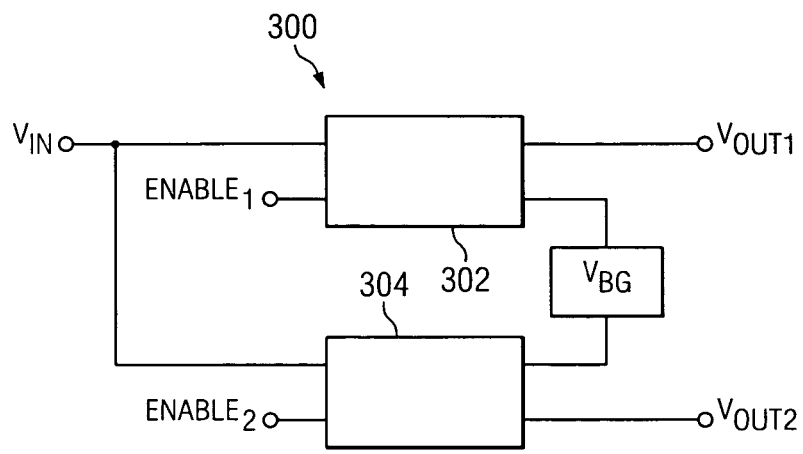
FIG. 3A illustrates a block diagram of a prior art power management device and dual channel amplifier circuit.
Figure 3B:
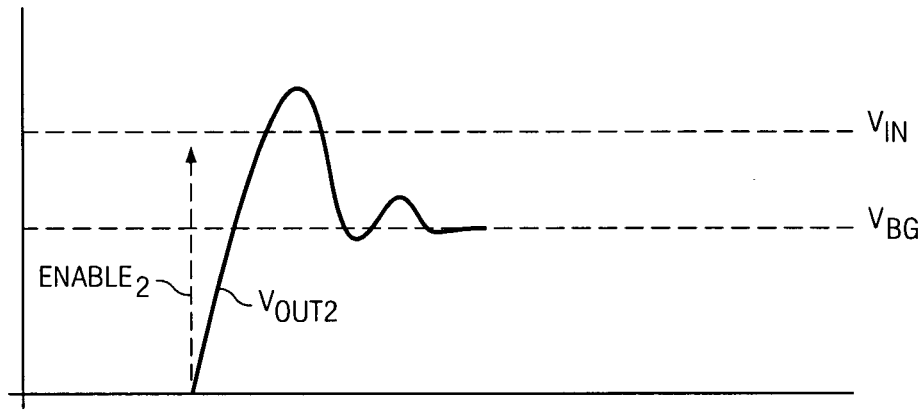
FIG. 3B illustrates a curve representing the voltage characteristics of a prior art dual channel amplifier circuit of FIG. 3A.
Figure 4:
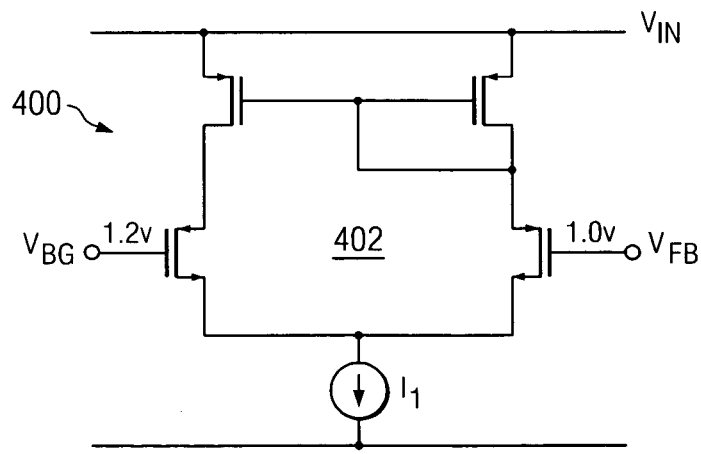
FIG. 4 illustrates a prior art error amplifier circuit.
Figure 5:
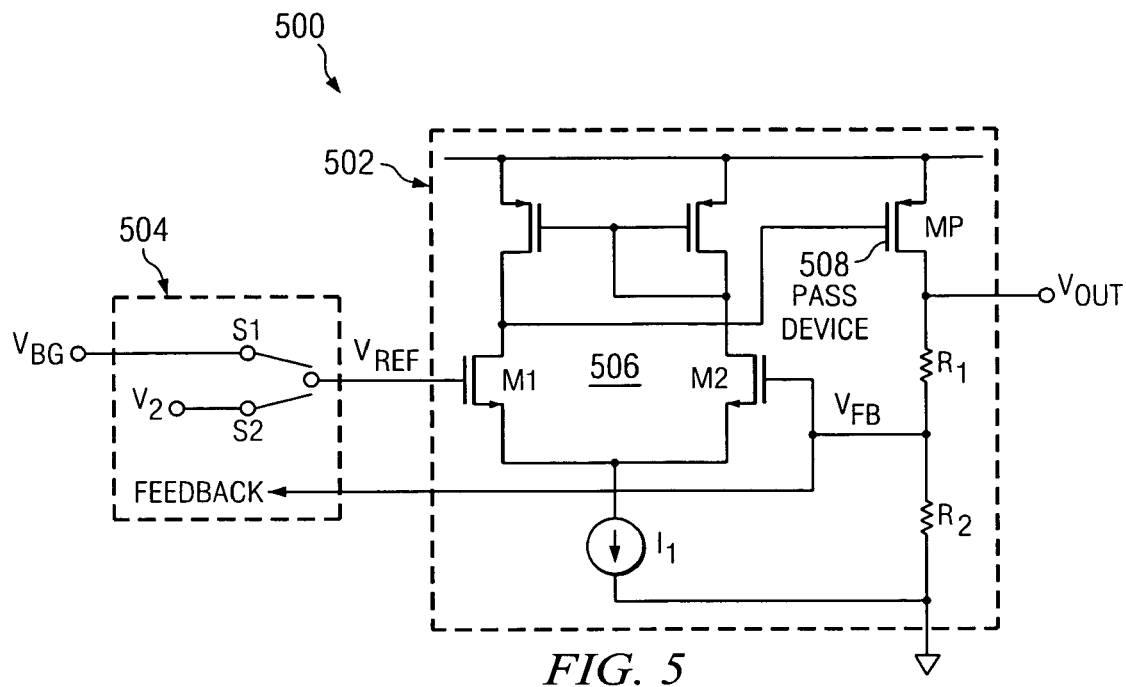
FIG. 5 illustrates a schematic diagram of an exemplary amplifier circuit configured with an exemplary soft-start circuit in accordance with an exemplary embodiment the present invention.

In accordance with an exemplary embodiment, with reference to FIG. 5, an exemplary amplifier circuit 500 comprises an LDO regulator circuit 502 and a soft-start circuit 504. LDO regulator circuit 502 comprises an error amplifier 506 and a pass device 508 configured to provide an output voltage $V_{OUT}$. LDO regulator circuit 502 further comprises a control loop including a feedback voltage $V_{FB}$ provided from pass device 508. Error amplifier 506 is powered by an input supply voltage $V_{IN}$, and comprises a first transistor $M_1$ having a gate terminal configured to provide a positive input connected to soft-start circuit 504, and a second transistor $M_2$ having a gate terminal configured to provide a negative input connected to feedback voltage $V_{FB}$. Pass device 508 comprises a power transistor $M_p$ configured to drive the output load at an output terminal $V_{OUT}$. Power transistor $M_p$ includes a gate terminal for receiving an amplified error signal from error amplifier 506 that is configured to control the output current flow of pass device 508 when driving the output load at output terminal $V_{OUT}$. Pass device 508 is further configured to feed back the error signal to error amplifier 506 by generating feedback voltage $V_{FB}$ from resistors $R_1$ and $R_2$. Pass device 508 can comprise various configurations, such as a PMOS or NMOS transistor device, an NPN follower, an NMOS follower, or common source PNP or PMOS transistors.

Soft-start circuit 504 is configured to provide a secondary reference voltage during initial start-up of amplifier circuit 500 before switching to an actual reference voltage. For example, soft-start circuit 504 can be configured to generate a secondary reference voltage $V_2$, and then through monitoring of feedback voltage $V_{FB}$ from error amplifier circuit 506, suitably switch in secondary reference voltage $V_2$ and an actual reference voltage to provide a controlled start-up process. The actual reference voltage can comprise various types of reference voltages, such as an actual silicon bandgap voltage $V_{BG}$ of approximately 1.2 volts, divided down silicon bandgap voltages of 0.4V and higher, partial $V_{BE}$ bandgap voltages of approximately 0.6V, and other variable references voltage up to 5 volts or more. Soft-start circuit 504 can utilize various switching configurations, represented by switches $S_1$ and $S_2$, for switching in secondary reference voltage $V_2$ and bandgap voltage $V_{BG}$.

Initially, soft-start circuit 504 begins with secondary reference voltage $V_2$ being switched in as a reference voltage to the positive input terminal of error amplifier 506 until such time that feedback voltage $V_{FB}$ exceeds secondary reference voltage $V_2$, and then can suitably switch in bandgap voltage $V_{BG}$ for the remainder of ramping up of output voltage $V_{OUT}$. As a result, the output voltage will ramp upwards following secondary reference voltage $V_2$ before transitioning and then will continue to ramp upwards to the level of feedback voltage $V_{FB}$, thus reducing or eliminating destructive overshoot. Moreover, such control of the start-up process can be realized without any effect or compromise to the control loop of error amplifier 506.

Secondary reference voltage $V_2$ suitably comprises the minimum amount of voltage required for power-up of the amplifier circuit components to permit operation. In effect, secondary reference voltage $V_2$ acts as a "virtual" bandgap reference voltage that suitably replaces bandgap voltage $V_{BG}$. Secondary reference voltage $V_2$ is suitably configured to be generated faster than bandgap voltage $V_{BG}$, since secondary reference voltage $V_2$ must be quickly used not only when bandgap voltage $V_{BG}$ is already on, but also when both are turned on simultaneously, i.e., secondary reference voltage $V_2$ should be generated quickly since it is utilized before bandgap voltage $V_{BG}$. In addition, secondary reference voltage $V_2$ is configured at a voltage level below that of bandgap voltage $V_{BG}$, for example well below the final bus voltage used to drive error amplifier 506. Configuring secondary reference voltage $V_2$ with lower current power dissipation can also be beneficial. In addition, secondary reference voltage $V_2$ can also be provided with higher noise limitations, and allow for lower noise requirements to achieved later once noise reduction capacitors within amplifier circuit 500 are fully charged.

Figure 6A:
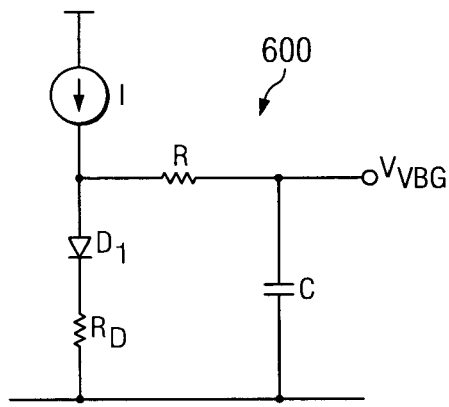
FIGS. 6A, 6B and 6C illustrate schematic diagrams of an exemplary circuits for generating a secondary reference voltages in accordance with an exemplary embodiment the present invention.
Figure 6B:
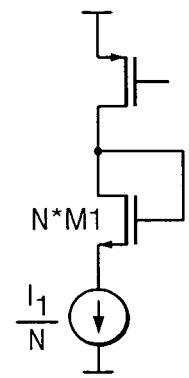
Figure 6C:
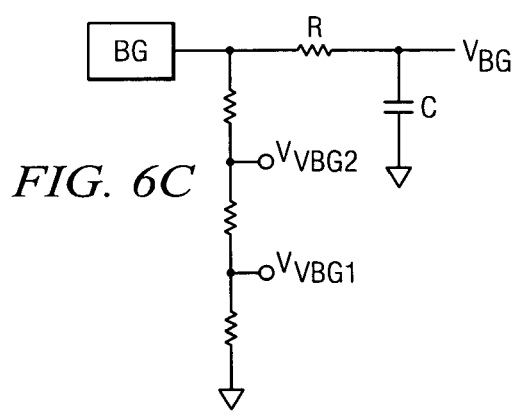

In accordance with an exemplary embodiment, with reference to FIG. 6A, a secondary reference voltage $V_2$ can be generated by a circuit 600 comprising a current source I configured with a temperature compensating circuit such as diode $D_1$ and resistor $R_D$ to provide a fast and reliable power source, such as a virtual bandgap voltage $V_{VBG}$; however, secondary reference voltage $V_2$ can also be generated in various other manners and configurations in addition to circuit 600 illustrated in FIG. 6A. For example, with reference to FIG. 6B, an exemplary secondary reference voltage $V_2$ can be generated by a circuit 600 configured to track the actual threshold voltage required for turning on amplifier circuit 500. In another exemplary embodiment, with reference to FIG. 6C, an exemplary secondary reference voltage $V_2$, or tertiary or other reference voltages can be generated by a circuit 600 configured to track the primary reference voltage for amplifier circuit 500.

Figure 7:
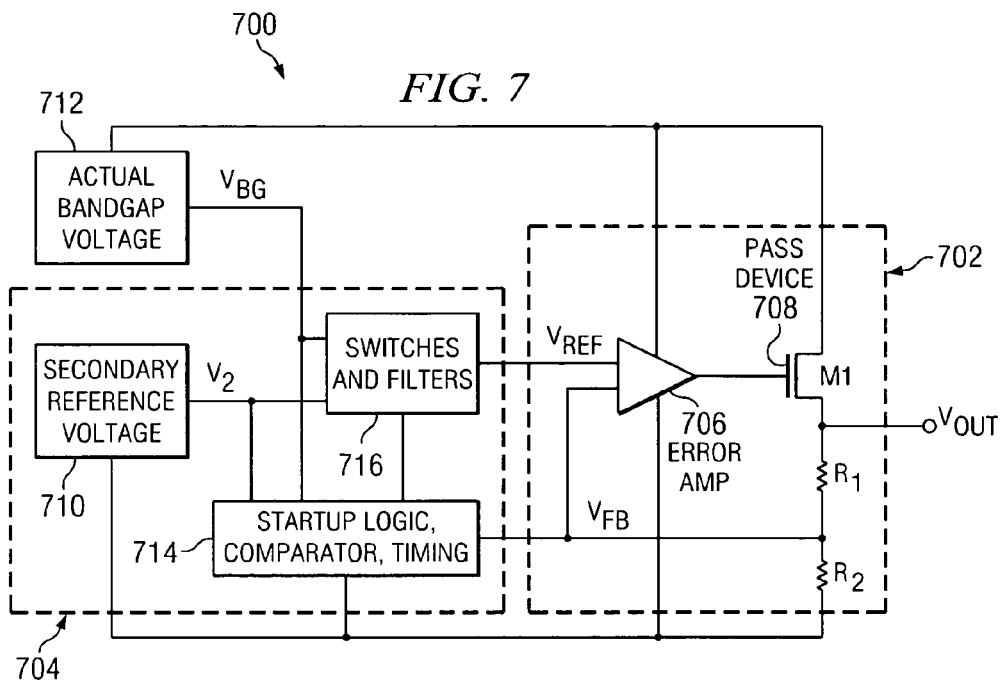
FIG. 7 illustrates a block diagram of an exemplary amplifier circuit and a soft-start circuit in accordance with an exemplary embodiment the present invention.

An exemplary soft-start circuit 504 can be configured in various manner for switching a secondary reference voltage and actual reference voltage to an amplifier circuit. For example, with reference to FIG. 7 in accordance with an exemplary embodiment of the present invention, an amplifier circuit 700 comprises an LDO circuit 702 and a soft-start circuit 704, with soft-start circuit 704 suitably comprising a second reference voltage circuit 710, a logic circuit 714, and a switching circuit 716. LDO circuit 702 suitably comprises an error amplifier 706 and a pass device 708 that can be configured as any conventional amplifier and devices for use in LDO circuits, such as error amplifier 506 and pass device 508. Error amplifier 706 is further configured to receive a voltage reference $V_{REF}$ from soft-start circuit 704 and a feedback voltage $V_{FB}$ generated from pass device 708.

Secondary reference voltage circuit 710 can suitably comprise any circuit configured for generating a voltage reference that is lower than a primary voltage reference, e.g., an actual bandgap voltage 712. In accordance with an exemplary embodiment, secondary reference voltage circuit 710 is also configured to be generated faster than actual bandgap voltage 712 and/or with lower current power dissipation. For example, secondary reference voltage circuit 710 can comprise voltage reference circuit 600 or any other circuit for generating a secondary reference voltage comprising the minimum amount of voltage required for power-up of amplifier circuit 700 to permit operation.

Logic circuit 714 is suitably configured for monitoring feedback voltage $V_{FB}$ and for determining the appropriate time for switching in secondary reference voltage circuit 710 and actual bandgap voltage 712. In accordance with an exemplary embodiment, logic circuit 714 comprises a comparator configured for measuring feedback voltage $V_{FB}$ and comparing its value to the value of the secondary reference voltage generated by secondary reference voltage circuit 710, and a timing circuit configured for control of switch circuit 716. Logic circuit 714 can suitably control switch circuit 716 to switch in secondary reference voltage circuit 710 and actual bandgap voltage 712. Logic circuit 714 and any comparators or timing circuits can comprise various configurations for providing the intended functions.

Switch circuit 716 is suitably configured for switching in secondary reference voltage circuit 710 and actual bandgap voltage 712, and can comprise any type of devices or components for providing switching functions. Switch circuit 716 can also be configured with filtering and other like functions to address any noise or other detriments caused by switching functions.

Figure 8:
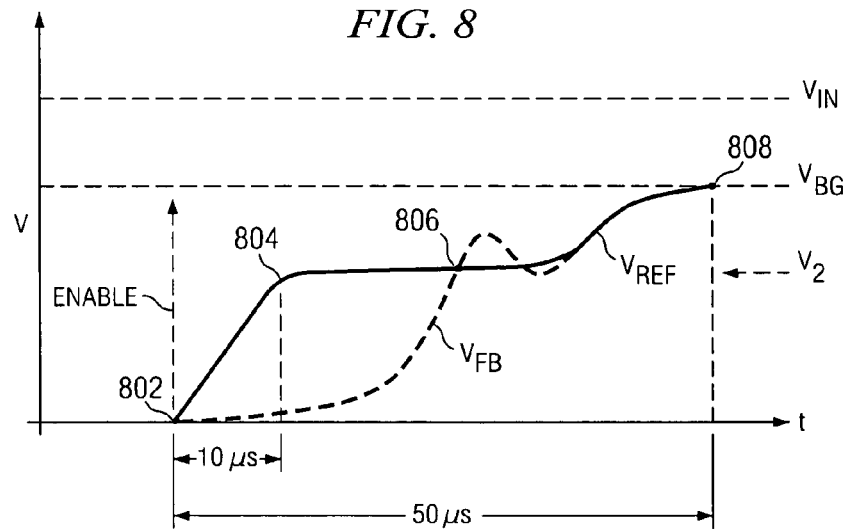
FIG. 8 illustrates a curve representing the voltage characteristics of an exemplary amplifier circuit configured with a soft-start circuit in accordance with the present invention.

With additional reference to FIG. 8, once an amplifier circuit is enabled (as represented by 802), then soft-start circuit 704 is configured to generate a secondary reference voltage $V_2$, e.g., a virtual bandgap voltage, through secondary reference voltage circuit 710. Ideally, secondary reference voltage $V_2$ is generated rather quickly, for example, within approximately 10 microseconds. Logic circuit 714 can suitably control switching circuit 716 to suitably switch in secondary reference voltage $V_2$ to provide reference voltage $V_{REF}$. Reference voltage $V_{REF}$ will then suitably charges upward until reaching the level of secondary reference voltage $V_2$ that comprises a voltage level sufficiently low enough to prevent overshoot of the expected output voltage VOUT but sufficiently high enough to turn on error amplifier 706, e.g., secondary reference voltage $V_2$ can comprise a voltage level of approximately 80% of the actual bandgap voltage (as represented by 804), and will momentarily hold steady. In accordance with an exemplary embodiment, this steady state can be facilitated by the use of large noise reduction capacitors, such as approximately 0.01 µF capacitors. Such reference voltage $V_{REF}$ is sufficient to at least turn on error amplifier 706.

Once feedback voltage $V_{FB}$ increases to meet or exceed the secondary reference voltage (as represented by 806), logic circuit 714 can suitably control switching circuit 716 to switch in the actual reference voltage $V_{BG}$ for reference voltage $V_{REF}$, in effect latching to reference voltage $V_{BG}$ to prevent any impact from further oscillation of feedback voltage $V_{FB}$. Reference voltage $V_{REF}$ will then suitably ramp upwards until reaching the level of bandgap voltage $V_{BG}$ (as represented by 808) and remain at that level until amplifier circuit 700 is powered down or disabled.

In the case of large noise reduction capacitors, the charging of which can be prolonged depending on the internal circuit design, the reference voltage can be held at the voltage $V_2$, e.g., the virtual bandgap voltage, until actual reference voltage $V_{BG}$ ramps upwards to within a final tolerance.

As a result, a fast start-up of amplifier circuit 700 can be realized, e.g., within approximately 50 microseconds, while destructive overshoot of output voltage $V_{OUT}$ can be suitably reduced or eliminated, as well as any delay from charging the noise reduction capacitor. In addition, such elimination of the destructive overshoot can be realized without affecting or compromising the dynamics of the control loop for LDO circuit 702. Such arrangements can be beneficial in a wide variety of applications, and in particular, within dual channel LDO circuit applications with independent enable pins and a single bandgap reference voltage.

The present invention has been described above with reference to various exemplary embodiments. However, those skilled in the art will recognize that changes and modifications may be made to the exemplary embodiments without departing from the scope of the present invention. For example, the various exemplary embodiments can be implemented with other types of power supply circuits in addition to the circuits illustrated above. These alternatives can be suitably selected depending upon the particular application or in consideration of any number of factors associated with the operation of the system. Moreover, these and other changes or modifications are intended to be included within the scope of the present invention, as expressed in the following claims.

The invention claimed is:

1. An amplifier circuit configured for providing an output voltage, said amplifier circuit comprising:
   a low dropout regulator configured for receiving a reference voltage and a feedback voltage within a control loop, and for providing output current to a load device; and
   a soft-start circuit configured to provide a secondary reference voltage to said low dropout regulator during start-up of said amplifier circuit to substantially eliminate destructive overshoot of the output voltage;
   wherein said soft-start circuit is configured to monitor feedback voltage generated by said low dropout regulator to determine when to switch from said secondary reference voltage to a bandgap reference voltage and provide said bandgap reference voltage to said low dropout regulator.

2. The amplifier circuit according to claim 1, wherein said soft-start circuit switches from said secondary reference voltage to said bandgap reference voltage when said feedback voltage ramps upwards to a level approximately equal to said secondary reference voltage.

3. The amplifier circuit according to claim 1, wherein said soft-start circuit switches from said secondary reference voltage to said bandgap reference voltage once said bandgap reference voltage is ramped upwards to within a final tolerance.

4. The amplifier circuit according to claim 1, wherein said soft-start circuit is configured to substantially eliminate destructive overshoot without affecting the operation of said control loop.

5. The amplifier circuit according to claim 1, wherein said soft-start circuit comprises a secondary reference generating circuit configured to generate said secondary reference voltage.

6. The amplifier circuit according to claim 5, wherein said secondary reference generating circuit is configured to generate said secondary reference voltage to a voltage level sufficient to turn on said low dropout regulator.

7. The amplifier circuit according to claim 6, wherein said secondary reference generating circuit is configured to generate said secondary reference voltage to a voltage level less than said bandgap reference voltage.

8. The amplifier circuit according to claim 7, wherein said secondary reference generating circuit is configured to generate said secondary reference voltage to a voltage level sufficiently low enough to prevent overshoot of an expected output voltage but sufficiently high enough to turn on said low drop-out regulator.

9. An amplifier circuit configured for providing an output voltage, said amplifier circuit comprising:
   a low dropout regulator configured for receiving a reference voltage and a feedback voltage within a control loop, and for providing output current to a load device; and
   a soft-start circuit configured to provide a secondary reference voltage to said low dropout regulator during start-up of said amplifier circuit to substantially eliminate destructive overshoot of the output voltage;
   wherein said soft-start circuit comprises a logic circuit suitably configured for monitoring said feedback voltage and for determining an appropriate time for switching from said secondary reference voltage to said bandgap reference voltage.

10. The amplifier circuit according to claim 9, wherein said logic circuit comprises a comparator configured for comparing said feedback voltage to said secondary reference voltage.

11. The amplifier circuit according to claim 9, wherein said logic circuit comprises a comparator configured for comparing said bandgap reference voltage to said secondary reference voltage.

12. The amplifier circuit according to claim 9, wherein said logic circuit comprises a timing circuit configured for controlling said switch circuit to switch said reference voltage received by said low dropout regulator from said secondary reference voltage to said feedback voltage.

13. An amplifier circuit configured for providing an output voltage, said amplifier circuit comprising:
   a low dropout regulator configured for receiving a reference voltage and a feedback voltage within a control loop, and for providing output current to a load device; and
   a soft-start circuit configured to provide a secondary reference voltage to said low dropout regulator during start-up of said amplifier circuit to substantially eliminate destructive overshoot of the output voltage;
   wherein said soft-start circuit comprises a switch circuit configured to switch said reference voltage received by said low dropout regulator from said secondary reference voltage to said bandgap reference voltage.

14. The amplifier circuit according to claim 13, wherein said soft-start circuit is configured to latch said reference voltage received by said low dropout regulator to said bandgap reference voltage.

15. A method configured for providing a soft start-up of an amplifier circuit, said method comprising:
   generating a secondary reference voltage within a soft-start circuit;
   providing said secondary reference voltage as a voltage reference to said amplifier circuit during start-up of said amplifier circuit; and
   switching said voltage reference from said secondary reference voltage to a bandgap reference voltage.

16. The method according to claim 15, wherein said method further comprises comparing a feedback voltage from said amplifier circuit to determine when to switch said voltage reference from said secondary reference voltage to said bandgap reference voltage.

17. The method according to claim 16, wherein soft-start circuit switches said voltage reference from said secondary reference voltage to said bandgap reference voltage when said feedback voltage at least meets a value approximately equal to said secondary reference voltage.

18. The method according to claim 15, wherein generating said secondary reference voltage comprises generating a voltage sufficient to turn on said amplifier circuit.

19. The method according to claim 18, wherein generating said secondary reference voltage comprises generating a voltage less than said bandgap reference voltage.

20. A low dropout regulator configured for receiving a reference voltage and a feedback voltage within a control loop, and for providing an output voltage, said low dropout regulator comprising:
   a soft-start circuit configured to provide a secondary reference voltage to said low dropout regulator during start-up to substantially eliminate destructive overshoot of the output voltage;

wherein said soft-start circuit is configured to monitor feedback voltage generated by said low dropout regulator to determine when to switch from said secondary reference voltage to a primary reference voltage and provide to said low dropout regulator.

21. The low dropout regulator according to claim 20, wherein said soft-start circuit switches from said secondary reference voltage to said primary reference voltage when said feedback voltage ramps upwards to a level approximately equal to said secondary reference voltage, and said primary reference voltage is within tolerance.

22. The low dropout regulator according to claim 20, wherein said soft-start circuit is configured to substantially eliminate destructive overshoot without affecting the operation of said control loop.

23. The low dropout regulator according to claim 20, wherein said soft-start circuit comprises a secondary reference generating circuit configured to generate said secondary reference voltage at a voltage level sufficient to turn on said low dropout regulator and less than said bandgap reference voltage.

* * * * *